(12) United States Patent
Oh

(10) Patent No.: US 12,346,190 B2
(45) Date of Patent: *Jul. 1, 2025

(54) SEMICONDUCTOR MEMORY DEVICE, ELECTRONIC DEVICE AND METHOD FOR SETTING THE SAME

(71) Applicant: Samsung Electronics Co., Ltd., Suwon-si (KR)

(72) Inventor: Ki-Seok Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/764,639

(22) Filed: Jul. 5, 2024

(65) Prior Publication Data

US 2024/0361823 A1    Oct. 31, 2024

Related U.S. Application Data

(63) Continuation of application No. 18/144,956, filed on May 9, 2023, now Pat. No. 12,086,011, which is a
(Continued)

(30) Foreign Application Priority Data

Oct. 8, 2019 (KR) .......................... 10-2019-0124370

(51) Int. Cl.
    *G06F 1/32*       (2019.01)
    *G06F 1/3234*     (2019.01)
    (Continued)

(52) U.S. Cl.
    CPC ........ *G06F 1/3275* (2013.01); *G11C 11/4074* (2013.01); *G11C 11/4076* (2013.01); *G11C 11/4096* (2013.01)

(58) Field of Classification Search
    None
    See application file for complete search history.

(56) References Cited

U.S. PATENT DOCUMENTS 7,099,215 B1    8/2006   Rotenberg et al.
7,155,617 B2   12/2006   Gary et al.
(Continued)

FOREIGN PATENT DOCUMENTS

CN    104737232 A    6/2015
CN    109920456 A    6/2019
(Continued)

OTHER PUBLICATIONS

Examination report dated Oct. 30, 2024 from the Chinese Patent Office for the corresponding Chinese Patent Application No. 202010759067.9.
(Continued)

*Primary Examiner* — Jaweed A Abbaszadeh
*Assistant Examiner* — Cheri L Harrington
(74) *Attorney, Agent, or Firm* — Muir Patent Law, PLLC

(57) ABSTRACT

An electronic device includes a semiconductor memory device configured to store process information and to output the process information to the outside; and a host configured to read the process information from the semiconductor memory device, and to select one of a plurality of operation modes depending on the process information so as to be set to an operation mode of the semiconductor memory device. The plurality of operation modes may define one or more of power consumption of the semiconductor memory device or a response characteristic of the semiconductor memory device.

16 Claims, 12 Drawing Sheets

Related U.S. Application Data continuation of application No. 15/930,732, filed on May 13, 2020, now Pat. No. 11,662,799.

(51) Int. Cl.
*G11C 11/40* (2006.01)
*G11C 11/4074* (2006.01)
*G11C 11/4076* (2006.01)
*G11C 11/4096* (2006.01)

(56) References Cited

U.S. PATENT DOCUMENTS

| | | | |
|---|---|---|---|
| 7,558,925 | B2 | 7/2009 | Bouchard et al. |
| 7,581,127 | B2 | 8/2009 | Rajan et al. |
| 8,028,257 | B2 | 9/2011 | Allen, Jr. et al. |
| 9,646,676 | B1 | 5/2017 | Hyun et al. |
| 9,754,648 | B2 | 9/2017 | Mirichigni et al. |
| 9,891,855 | B2 | 2/2018 | Yang et al. |
| 11,144,701 | B2 | 10/2021 | Egan et al. |
| 2006/0098513 | A1 | 5/2006 | Kim et al. |
| 2007/0058464 | A1 | 3/2007 | Nakanishi |
| 2008/0080261 | A1 | 4/2008 | Shaeffer et al. |
| 2009/0154257 | A1 | 6/2009 | Fujioka et al. |
| 2010/0262724 | A1 | 10/2010 | Nakanishi |
| 2012/0147692 | A1 | 6/2012 | Nakamura et al. |
| 2013/0311717 | A1 | 11/2013 | Kim et al. |
| 2013/0311792 | A1 | 11/2013 | Ponnathota et al. |
| 2014/0119099 | A1 | 5/2014 | Clark et al. |
| 2014/0244947 | A1 | 8/2014 | Song |
| 2017/0169875 | A1 | 6/2017 | Gans |
| 2017/0294216 | A1 | 10/2017 | Doo et al. |
| 2017/0315747 | A1 | 11/2017 | Yang et al. |
| 2017/0330609 | A1 | 11/2017 | Roy |
| 2019/0172510 | A1 | 6/2019 | Kim et al. |
| 2019/0179553 | A1 | 6/2019 | Kim et al. |
| 2020/0174866 | A1 | 6/2020 | Ayyapureddi et al. |
| 2020/0264884 | A1 | 8/2020 | Jung |
| 2021/0065772 | A1 | 3/2021 | Suh et al. |
| 2021/0193216 | A1 | 6/2021 | Tian |
| 2021/0295893 | A1 | 9/2021 | Lu et al. |

FOREIGN PATENT DOCUMENTS

| | | |
|---|---|---|
| KR | 1020140107890 A | 9/2014 |
| KR | 1020170124017 A | 11/2017 |
| KR | 1020180137430 B1 | 6/2023 |

OTHER PUBLICATIONS

Donghyuk Lee et al., Adaptive-Latency DRAM Optimizing, 2015 IEEE 21st International Symposium on HPCA.

Kevin K. Chang et al., Understanding and Improving the Latency of DRAM-Based Memory Systems, Carnegie Mellon University Pittsburgh, PA May 2017.

Kevin K. Chang et al., Understanding Reduced-Voltage Operation in Modem DRAM Devices Experimental Characterization, Analysis, and Mechanisms, Proc. ACM Meas. Anal. Comput. Syst., vol. 1, No. 1, Article 9. Publication date Jun. 2017.

FIG. 4A

Mode set

| OP | Mode | Latency | Voltage | Speed range | Remark |
|---|---|---|---|---|---|
| 000 | Mode1 | 1 x L | 1 x VDD | ~6400 Mbps | Normal Mode |
| 001 | Mode2 | 0.8 x L | 1 x VDD | ~7200 Mbps | High speed mode |
| 010 | Mode3 | 0.5 x L | 1 x VDD | ~8500 Mbps | Boost mode |
| 011 | Mode4 | 1 x L | 0.8 x VDD | ~3200 Mbps | Low PWR mode |
| 100 | Mode5 | 1 x L | 0.6 x VDD | ~1600 Mbps | Extreme Low PWR mode |
| ⋮ | ⋮ | ⋮ | ⋮ | ⋮ | ⋮ |

FIG. 4B

Mode set

| OP | Mode | Latency | Voltage | Speed range | Remark |
|---|---|---|---|---|---|
| 000 | Mode1 | 1 x L | 1 x VDD | ~6400 Mbps | Normal Mode |
| 001 | Mode2 | 0.8 x L | 1 x VDD | ~7200 Mbps | HS1 mode |
| 010 | Mode3 | 0.6 x L | 1 x VDD | ~8000 Mbps | HS2 mode |
| 011 | Mode4 | 0.5 x L | 1 x VDD | ~8500 Mbps | HS3 mode |
| 100 | Mode5 | 0.4 x L | 1 x VDD | ~9000 Mbps | HS4 mode |
| ⋮ | ⋮ | ⋮ | ⋮ | ⋮ | ⋮ |

FIG. 4C

Mode set

| OP | Mode | Latency | Voltage | Speed range | Remark |
|---|---|---|---|---|---|
| 000 | Mode1 | 1 x L | 0.6 x VDD | ~5400 Mbps | LPHS1 Mode |
| 001 | Mode2 | 0.8 x L | 0.6 x VDD | ~6200 Mbps | LPHS2 Mode |
| 010 | Mode3 | 0.6 x L | 0.6 x VDD | ~7000 Mbps | LPHS3 Mode |
| 011 | Mode4 | 0.5 x L | 0.6 x VDD | ~7500 Mbps | LPHS4 Mode |
| 100 | Mode5 | 0.4 x L | 0.6 x VDD | ~8000 Mbps | LPHS5 Mode |
| ⋮ | ⋮ | ⋮ | ⋮ | ⋮ | ⋮ |

FIG. 4D

Mode set

| OP | Mode | Latency | Voltage | Speed range | Remark |
|---|---|---|---|---|---|
| 000 | Mode1 | 1 x L | 1 x VDD | ~6400 Mbps | Normal Mode |
| 001 | Mode2 | 1 x L | 0.9 x VDD | ~6000 Mbps | LP1 mode |
| 010 | Mode3 | 1 x L | 0.8 x VDD | ~5500 Mbps | LP2 mode |
| 011 | Mode4 | 1 x L | 0.7 x VDD | ~5000 Mbps | LP3 mode |
| 100 | Mode5 | 1 x L | 0.6 x VDD | ~4500 Mbps | LP4 mode |
| ⋮ | ⋮ | ⋮ | ⋮ | ⋮ | ⋮ |

FIG. 5

| PI | Remark |
|---|---|
| 0 | Legacy Process |
| 1 | Enhanced Process |

SEMICONDUCTOR MEMORY DEVICE, ELECTRONIC DEVICE AND METHOD FOR SETTING THE SAME

CROSS-REFERENCE TO RELATED APPLICATION

This is a continuation of U.S. patent application Ser. No. 18/144,956 filed May 9, 2023, which claims priority under 35 U.S.C. § 120 to, U.S. patent application Ser. No. 15/930,732 filed May 13, 2020, now issued as U.S. Pat. No. 11,662,799, each of which is incorporated by reference herein in its entirety.

Korean Patent Application No. 10-2019-0124370, filed on Oct. 8, 2019, in the Korean Intellectual Property Office, and entitled: "Semiconductor Memory Device, Electronic Device and Method for Setting the Same," is incorporated by reference herein in its entirety.

BACKGROUND

1. Field

Embodiments relate to a semiconductor memory device, an electronic device including the same, and a method for setting the same.

2. Description of the Related Art

There is a dramatically increasing use of mobile devices such as a smartphone, a tablet personal computer (PC), a digital camera, an MP3 player, personal digital assistant (PDA), and a wearable device.

SUMMARY

Embodiments are directed to an electronic device, including a semiconductor memory device configured to store process information and to output the process information to the outside; and a host configured to read the process information from the semiconductor memory device, and to select one of a plurality of operation modes depending on the process information so as to be set to an operation mode of the semiconductor memory device. The plurality of operation modes may define one or more of power consumption of the semiconductor memory device or a response characteristic of the semiconductor memory device.

Embodiments are also directed to method for setting a semiconductor memory device, the method including reading process information from the semiconductor memory device; determining whether the process information indicates an enhanced process or a legacy process; determining an operating voltage of the semiconductor memory device or a latency by which data are output in response to a read command of the semiconductor memory device, depending on the determination result; and setting a mode register set of the semiconductor memory device such that the semiconductor memory device operates depending on the determined latency or the determined operating voltage.

Embodiments are also directed to semiconductor memory device, including a cell array including a plurality of DRAM cells to store data; a peripheral circuit configured to write data in the cell array, or to sense and output data stored in the cell array; and a mode register set circuit configured to output process information about the peripheral circuit to the outside, and to set an output latency of data and a level of an operating voltage of the peripheral circuit in response to a mode register write request.

BRIEF DESCRIPTION OF THE FIGURES

Features will become apparent to those of skill in the art by describing in detail example embodiments with reference to the attached drawings in which:

FIGS. 4A to 4D are tables illustrating an example of a mode set of FIG. 1.

FIG. 5 is a table illustrating device information of FIG. 1.

DETAILED DESCRIPTION

Below, a DRAM will be described as an example of a main memory or a working memory to describe features and functions of example embodiments. However, one skilled in the art may easily understand other merits and performance of example embodiments depending on the contents disclosed here. For example, the features of example embodiments may be applied to a phase-change RAM (PRAM), a magnetoresistive RAM (MRAM), a resistive RAM (ReRAM), a ferroelectric RAM (FRAM), a NOR flash memory, etc. as a working memory device. Here, the memory device may be a memory storing an instruction or data that are processed in an electronic device. In this specification, the term "training" may mean an operation of searching for a latency or a signal level of a memory channel to provide the optimum reliability.

Below, example embodiments will be described in detail with reference to the accompanying drawings.

Figure 1:
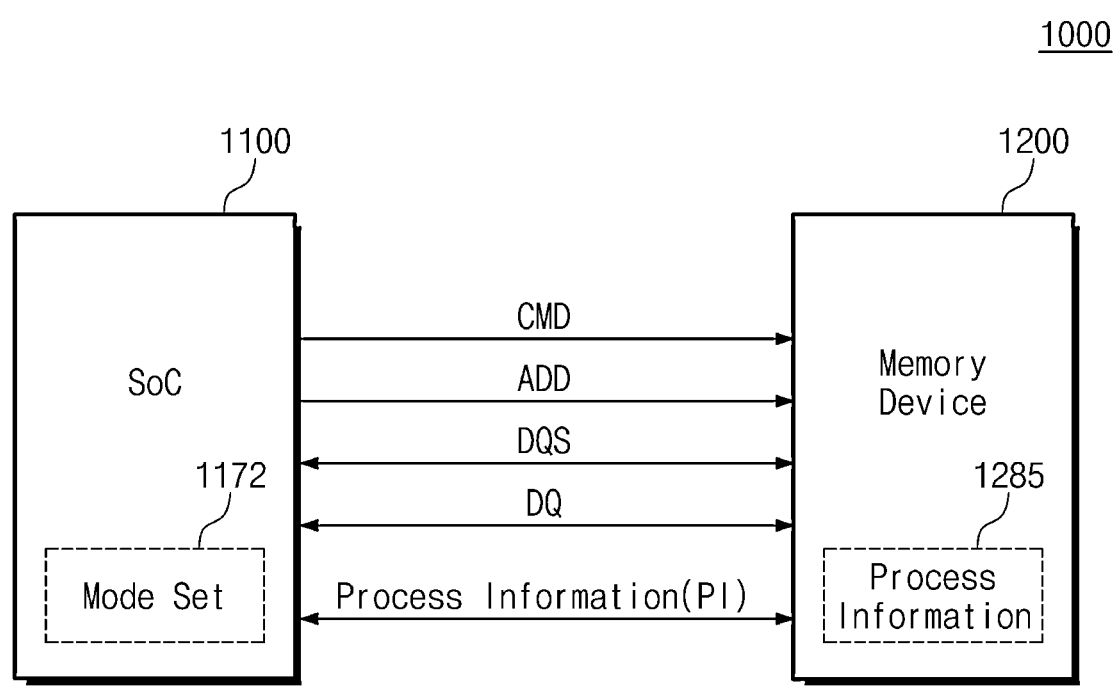
FIG. 1 is a block diagram illustrating an electronic device according to an example embodiment.

FIG. 1 is a block diagram illustrating an electronic device according to an example embodiment.

Referring to FIG. 1, an electronic device 1000 according to an example embodiment may include a system-on-chip 1100 and a memory device 1200. One or more channels for exchanging signals and data may be provided between the system-on-chip 1100 and the memory device 1200.

The system-on-chip 1100 may execute various applications, for example, based on a request of a user. To execute an application, the system-on-chip 1100 may load and execute the application onto the DRAM 1200. The system-on-chip 1100 may drive an operating system (OS) and may execute various applications on the operating system. The system-on-chip 1100 may write data in the memory device 1200 or may read data stored in the memory device 1200. The system-on-chip 1100 may include a memory controller (not illustrated) for controlling the memory device 1200.

The system-on-chip 1100 may include a mode set 1172, which is parameter information for controlling the latency of the memory device 1200 with reference to process information PI provided from the memory device 1200. The system-on-chip 1100 may determine whether the memory device 1200 is a semiconductor device to which an enhanced process is applied, through the process information PI.

For example, the memory device 1200 may be manufactured using, for example, a high-K metal gate (HKMG) process or a fin field effect transistor (FinFET) process to form high-performance logic components, and in this case, speed and power characteristics of the memory device 1200 may be markedly improved through voltage level setting, clock frequency setting, or latency setting, as compared to a memory device manufactured using on a legacy process. The system-on-chip 1100 may determine whether the memory device 1200 is a semiconductor device to which the enhanced process is applied, through the process information PI. When a process applied to the memory device 1200 is detected through the process information PI, the system-on-chip 1100 may set the memory device 1200 to a parameter corresponding to one mode set 1172, which a user selects, from among the mode sets 1172 corresponding to various performance parameters (which may be determined in advance).

Afterwards, the communication between the system-on-chip 1100 and the memory device 1200 may be performed depending on the set operation parameter. The system-on-chip 1100 may request and receive the process information PI from the memory device 1200 in booting or under a particular condition. The system-on-chip 1100 may control the memory device 1200 based on the set operation parameter and may provide a performance that the user requires.

The memory device 1200 may be provided as a main memory or a working memory of the electronic device 1000. When the electronic device 1000 is booted up, the operating system OS or application programs may be loaded onto the memory device 1200. For example, when the system-on-chip 1100 is booted up, an OS image stored in a storage device may be loaded onto the memory device 1200, based on a booting sequence. Overall input/output operations of the system-on-chip 1100 may be supported by the operating system OS. Likewise, application programs that are selected by a user or are used to provide a basic service may be loaded onto the memory device 1200. In addition, the memory device 1200 may be used as, for example, a buffer memory to store image data provided from an image sensor such as a camera.

While the electronic device 1000 is driven, the operating system OS, a running application program, update data, etc., may be stored in the memory device 1200. The memory device 1200 may also stores process information (PI) 1285 therein. For example, the process information (PI) 1285 may be information about a process technology used to manufacture the memory device 1200, as described above. In another implementation, the process information (PI) 1285 may be provided in the form of a flag signal indicating whether a process applied to the memory device 1200 is an enhanced process or a legacy process.

The system-on-chip 1100 may provide a command CMD, an address ADD, a data strobe signal DQS, and a data signal DQ to the memory device 1200. In addition, the memory device 1200 may output the process information (PI) 1285 to the system-on-chip 1100 through, for example, a data channel or through a separate dedicated pin.

The electronic device 1000 according to an example embodiment may receive the process information (PI) 1285 of the memory device 1200 and may set a parameter for adjusting performances of the memory device 1200, such as power consumption and a latency. Here, the latency means a time interval tAA from a time when a read command is provided to the memory device 1200 to a time when data are output. Accordingly, in the case where a new process technology is applied to the memory device 1200, it may be possible to apply various options for improving the performance of the electronic device 1000 or reducing the power consumption of the electronic device 1000. In addition, it may be possible to decrease the latency of the memory device 1200, to which a new process technology is applied, to various levels.

Figure 2:
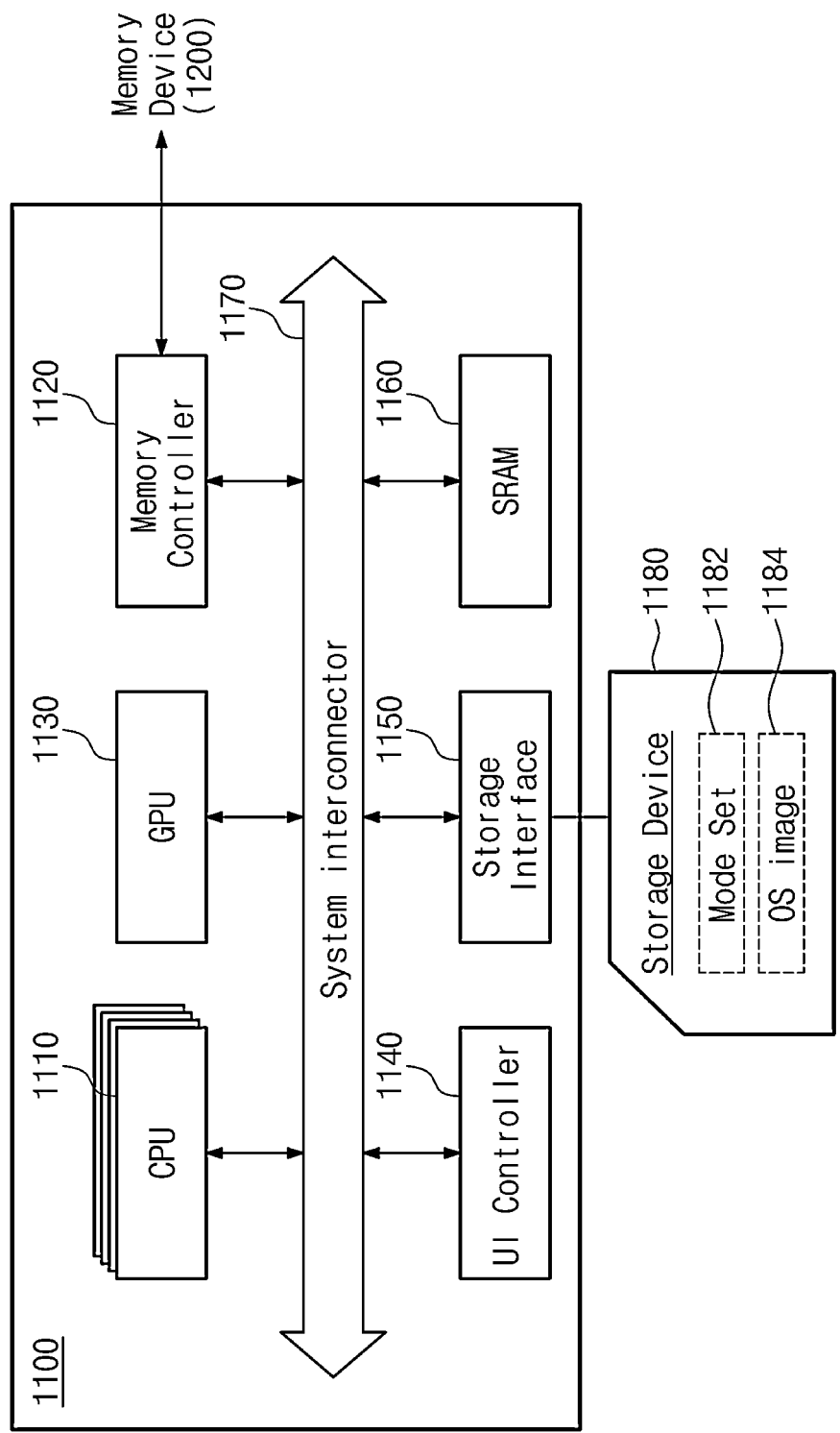
FIG. 2 is a block diagram illustrating a structure of a system-on-chip according to an example embodiment.

FIG. 2 is a block diagram illustrating a structure of a system-on-chip according to an example embodiment.

Referring to FIG. 2, the system-on-chip 1100 may be connected to a storage device 1180 and the memory device 1200. Although not illustrated in FIG. 2, the system-on-chip 1100 may also be connected to a device such as a liquid crystal display device or a touch panel.

The system-on-chip 1100 may include a central processing unit (CPU) 1110, a memory controller 1120, a graphics processing unit (GPU) 1130, a user interface (UI) controller 1140, a storage interface 1150, a static random access memory (SRAM) 1160, and a system interconnector 1170. Other components may be provided on the system-on-chip 1100. For example, the system-on-chip 1100 may include a hardware codec for processing image data, a security block, and the like.

The CPU 1110 may execute software (for example, an application program, an operating system, and device drivers) to be executed in the system-on-chip 1100. The CPU 1110 may execute the operating system OS loaded onto the memory device 1200. The CPU 1110 may execute various application programs to be driven based on the operating system OS. For example, in booting, the CPU 1110 may fetch and execute a boot code or a training code loaded onto the SRAM 1160 or the memory device 1200. The CPU 1110 may be, for example, a homogeneous multi-core processor or a heterogeneous multi-core processor.

The memory controller 1120 may provide interfacing between the memory controller 1120 and the system-on-chip 1100. The memory controller 1120 may access the memory device 1200 in response to a request of the CPU 1110 or another IP. For example, the memory controller 1120 may write data in the memory device 1200 in response to a write request of the CPU 1110. Also, the memory controller 1120 may read data from the memory device 1200 and may provide the read data to the CPU 1110 or the storage interface 1150. The memory controller 1120 may release rank interleaving associated with the memory device 1200 for the purpose of performing a training operation. The memory controller 1120 of example embodiments may set a parameter corresponding to a mode selected from the mode set 1172 to the memory device 1200.

The GPU 1130 may perform various graphics operations in response to a request of the CPU 1110. Thus, the GPU 1130 may convert process-requested data to data suitable for a display (not illustrated). The GPU 1130 use an operation structure that is suitable for parallel processing in which similar operations are repeatedly processed. Accordingly, the GPU 1130 may have a structure that is able to be used to perform various operations requiring high-speed parallel processing as well as a graphic operation. In an implementation, the system-on-chip 1100 may be implemented without the GPU 1130.

The user interface controller 1140 may controls user inputs and outputs from and to user interface devices (for example, a keyboard, a touch panel, and a display). For example, the user interface controller 1140 may display a keyboard screen for inputting data to the display (not illustrated) under control of the CPU 1110. The user interface controller 1140 may control the display such that the user-requested data are displayed. The user interface controller 1140 may decode data, which are provided from user input devices such as a keyboard, a mouse, and a touch panel, to user input data.

The storage interface 1150 may control the storage device 1180 in response to a request of the CPU 1110. Thus, the storage interface 1150 may provide an interface between the system-on-chip 1100 and the storage device 1180. For example, data processed by the CPU 1110 may be stored in the storage device 1180 through the storage interface 1150. In addition, data stored in the storage device 1180 may be provided to the CPU 1110 through the storage interface 1150. Parameters corresponding to a mode set 1182 selected by the user of example embodiments may be stored in the storage device 1180 through the storage interface 1150.

The SRAM 1160 may be provided as a working memory of the CPU 1110. For example, a boot loader for executing booting or codes may be loaded onto the SRAM 1160.

The system interconnector 1170 may be a system bus for providing an on-chip network within the system-on-chip 1100. The system interconnector 1170 may include, for example, a data bus, an address bus, and a control bus. The data bus may be a path through which data move, and the data bus may provide a memory access path through which the memory device 1200 or the storage device 1180 is accessed. The address bus may provide an address exchange path between intellectual properties. The control bus may provide a path through which control signals are transferred between the intellectual properties. The system interconnector 1170 may include arbitration devices for efficient management.

The storage device 1180 may be a storage medium for the system-on-chip 1100. The storage device 1180 may store application programs, an OS image 1184, and various kinds of data. For example, the mode set 1182 for adjusting the performance or characteristic of the memory device 1200 may be stored in the storage device 1180. In addition, a training code TC for training the memory device 1200 may be stored in a particular area of the storage device 1180. The storage device 1180 may be implemented with a memory card (for example, MMC, eMMC, SD, and microSD). In an implementation, the storage device 1180 may include a next-generation nonvolatile memory, such as a PRAM, an MRAM, a ReRAM, or a FRAM, or a NOR flash memory. As another example, the storage device 1180 may be an embedded memory that is provided within the system-on-chip 1100.

As described above, the system-on-chip 1100 may adjust parameters of the memory device 1200, such as a latency, an operating voltage, a speed, with reference to the process information PI provided from the memory device 1200.

Figure 3:
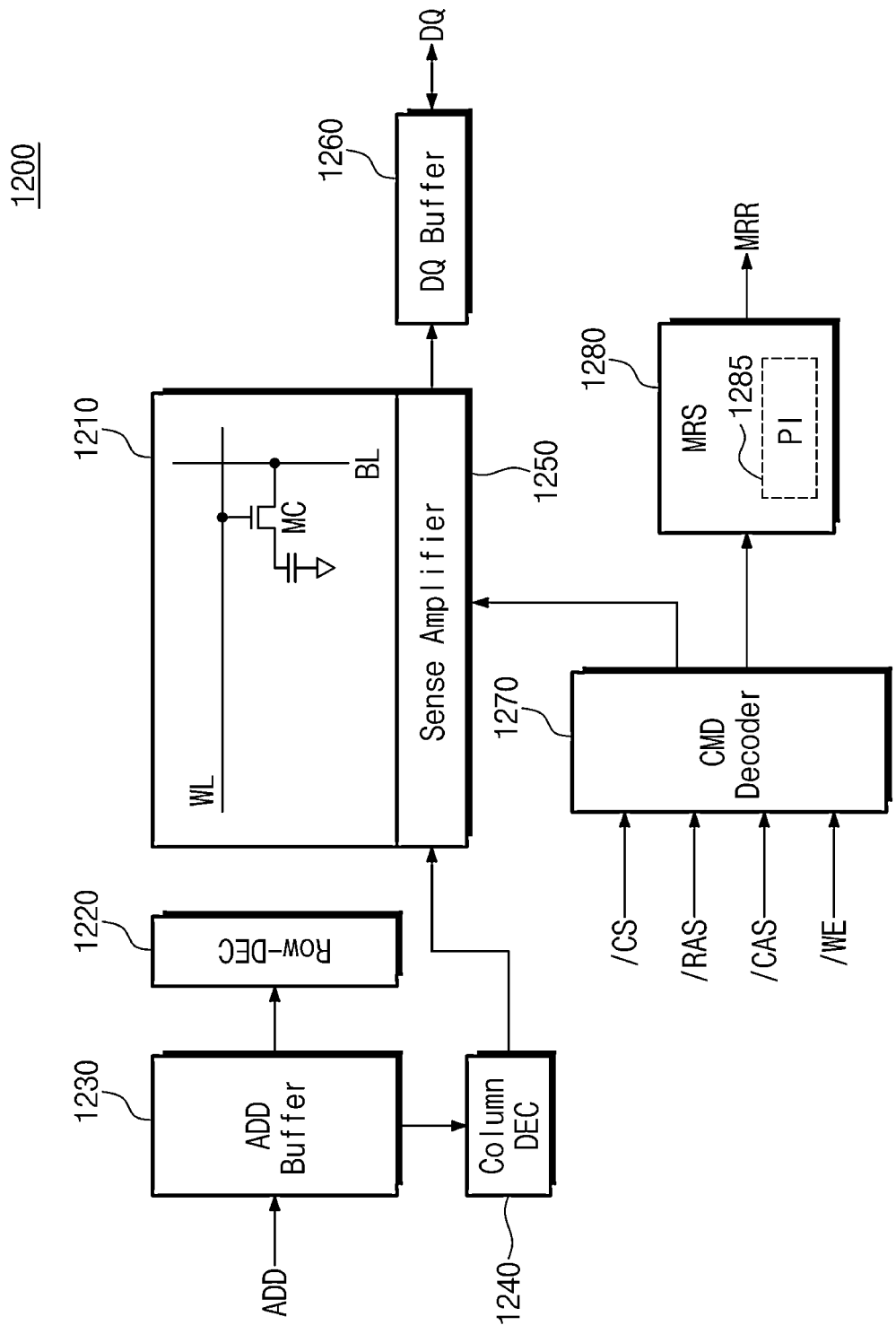
FIG. 3 is a block diagram illustrating a configuration of a memory device of FIG. 1.

FIG. 3 is a block diagram illustrating a configuration of a memory device of FIG. 1.

Referring to FIG. 3, the memory device 1200 may include a cell array 1210, a row decoder 1220, an address buffer 1230, a column decoder 1240, a sense amplifier 1250, a data input/output (DQ) buffer 1260, a command decoder 1270, and a mode register set 1280.

The cell array 1210 may include a plurality of memory cells MC that are connected with word lines and bit lines, and are arranged in a row direction and a column direction. Each of the memory cells MC may include, for example, a cell capacitor and an access transistor. In each of the memory cells MC, a gate of the access transistor may be connected to one of the word lines arranged in the row direction. A first end of the access transistor may be connected to a bit line BL or a complementary bit line (BLB) extending in the column direction. A second end of the access transistor may be connected to the cell capacitor.

The row decoder 1220 may select a word line of a memory cell to be accessed in response to the input address ADD. The row decoder 1220 may decode the input address ADD and enable a word line corresponding to the decoded address. Also, in a self-refresh mode of operation, the row decoder 1220 may decode a row address generated from an address counter (not illustrated) and may enable a word line corresponding to the decoded address. The column decoder 1240 may select a bit line of a memory cell targeted for a read operation or a write operation.

The address buffer 1230 may temporarily store the address ADD input from the outside. The address buffer 1230 may provide the stored address ADD to the row decoder 1220 or the column decoder 1240. The address ADD of an external signaling manner may be converted in an internal signaling manner of the memory device 1200 by the address buffer 1230.

The sense amplifier 1250 may write data in a memory cell through a selected bit line. The sense amplifier 1250 may sense data stored in a selected memory cell and may provide the sensed data to the DQ buffer 1260. The sense amplifier 1250 may include components for storing the input data in the selected memory cell. The sense amplifier 1250 may perform an operation (for example, a rewrite operation) of reading data stored in a memory cell and writing the read data back to the memory cell, in the self-refresh mode.

The DQ buffer 1260 may temporarily store the write data input from the outside and provide the write data to the sense amplifier 1250. The DQ buffer 1260 may output the sensed data provided from the sense amplifier 1250 to the outside. The DQ buffer 1260 may provide the data to the sense amplifier 1250 and may output the data sensed by the sense amplifier 1250 to the outside.

The command decoder 1270 may determine the input command with reference to signals /CS, /RAS, /CAS, and /WE applied from the outside. The command decoder 1270 may write or read data in or from the cell array 1210 in response to the command provided from the outside. The command decoder 1270 may write data in the mode register set 1280 depending on a command and an address provided from the outside. An auto refresh operation may be input through a combination of the control signals /CS, /RAS, /CAS, and /WE.

The mode register set 1280 may set an internal mode register in response to the MRS command for specifying an operation mode of the memory device 1200 and the address signal ADD. The process information (PI) 1285 of the memory device 1200 may be stored in the mode register set 1280 of example embodiments and may be output to the outside in response to a mode register read (MRR) request. In another embodiment, the process information (PI) 1285 may be separately programmed at a programmable component and may be output in the form of a flag signal depending on a request of the outside. In this case, a separate pin for outputting the process information PI in the form of a flag signal may be formed at the memory device 1200.

An example memory device 1200 implemented with a DRAM is described above. However, a technology applied to the memory device 1200 of example embodiments may be applied to various memories or storage devices, as well as the DRAM.

FIGS. 4A to 4D are tables illustrating an example of a mode set of FIG. 1.

Referring to FIG. 4A, a mode set may include a plurality of modes depending on a speed or power consumption.

A first mode Mode1 corresponding to an operation code of "000" may corresponds to a normal mode. Thus, according to parameter settings corresponding to the first mode Mode1, such as a clock frequency or a driving voltage VDD, the memory device 1200 may operate at a speed of, for example, 6400 Mbps maximally. Thus, a latency from a time when a read command of the memory device 1200 is provided to a time when data are output may be an "L" time or less (L being, for example, 22 ns).

A second mode Mode2 corresponding to an operation code of "001" may correspond to a high-speed mode. In the second mode Mode2, a level of a voltage that is provided to the memory device 1200 may be identical to a level of a voltage VDD provided in the normal mode. However, according to parameter settings or a clock frequency corresponding to the second mode Mode2, the memory device 1200 may operate at a speed of, for example, 7200 Mbps maximally.

A third mode Mode3 corresponding to an operation code of "010" may correspond to a boost mode. In the third mode Mode3, a level of a voltage that is provided to the memory device 1200 may be identical to the level of the voltage VDD provided in the normal mode. However, according to parameter settings or a clock frequency corresponding to the third mode Mode3, the memory device 1200 may operate at a speed of, for example, 8500 Mbps maximally.

A fourth mode Mode4 corresponding to an operation code of "011" may correspond to a low-power mode. In the fourth mode Mode4, a driving voltage that is provided to the memory device 1200 may be a voltage (for example, 0.8×VDD) lower than the voltage provided in the normal mode. According to parameter settings or a clock frequency corresponding to the fourth mode Mode4, the memory device 1200 may operate at a speed of, for example, 3200 Mbps maximally.

A fifth mode Mode5 corresponding to an operation code of "100" may correspond to an extreme low-power mode. In the fifth mode Mode5, a driving voltage that is provided to the memory device 1200 may be a voltage that is lower (for example, 0.6×VDD) than the voltage provided in the low-power mode. According to parameter settings or a clock frequency corresponding to the fifth mode Mode5, the memory device 1200 may operate at a speed of, for example, 1600 Mbps maximally.

An example mode set is described above. In the case where the process information PI of the memory device 1200 corresponds to an enhanced process, the system-on-chip 1100 may select a mode capable of improving a performance or a power efficiency, and may set the selected mode to the memory device 1200.

FIG. 4B is a table illustrating another embodiment of a mode set.

Referring to FIG. 4B, in this mode set, levels of driving voltages of respective modes may be identical. However, in this mode set, operating speeds of the modes may be different even under the same driving voltage condition.

The first mode Mode1 corresponding to an operation code of "000" may correspond to a normal mode. In the first mode Mode1, the memory device 1200 may operate at a speed of, for example, 6400 Mbps maximally.

The second mode Mode2 corresponding to an operation code of "001" may correspond to a first high-speed mode HS1. According to a parameter condition of the second mode Mode2, the memory device 1200 may operate at a speed of, for example, 7200 Mbps maximally.

The third mode Mode3 corresponding to an operation code of "010" may correspond to a second high-speed mode HS2. In the third mode Mode3, the memory device 1200 may operate at a speed of, for example, 8000 Mbps maximally.

The fourth mode Mode4 corresponding to an operation code of "011" may correspond to a third high-speed mode HS3. In the fourth mode Mode4, the memory device 1200 may operate at a speed of, for example, 8500 Mbps maximally.

The fifth mode Mode5 corresponding to an operation code of "100" may correspond to a fourth high-speed mode HS4. In the fifth mode Mode5, the memory device 1200 may operate at a speed of, for example, 9000 Mbps maximally.

FIG. 4C is a table illustrating another embodiment of a mode set.

Referring to FIG. 4C, in this mode set, a level of a driving voltage of each mode may be fixed to a level (for example, 0.6×VDD) lower than a voltage level of the normal mode. However, a latency may vary depending on an increase in speed.

The first mode Mode1 corresponding to an operation code of "000" may correspond to a first low-power, high-speed mode LPHS1. In the first mode Mode1, the memory device 1200 may operate at a speed of, for example, 5400 Mbps maximally.

The second mode Mode2 corresponding to an operation code of "001" may correspond to a second low-power, high-speed mode LPHS2. In the second mode Mode2, even though a condition of the voltage level (for example, 0.6×VDD) does not change, a latency (for example, 0.8×L) may decrease, and the memory device 1200 may operate at a speed of, for example, 6200 Mbps maximally.

The third mode Mode3 corresponding to an operation code of "010" may correspond to a third low-power, high-speed mode LPHS3. In the third mode Mode3, even though a condition of the voltage level (for example, 0.6×VDD) does not change, a latency (for example, 0.6×L) may decrease compared to the second mode Mode2, and the memory device 1200 may operate at a speed of, for example, 7000 Mbps maximally.

The fourth mode Mode4 corresponding to an operation code of "011" may correspond to a fourth low-power, high-speed mode LPHS4. In the fourth mode Mode4, under a condition of the voltage level (for example, 0.6×VDD), a latency (for example, 0.5×L) may decrease compared to the third mode Mode3, and the memory device 1200 may operate at a speed of, for example, 7500 Mbps maximally.

The fifth mode Mode5 corresponding to an operation code of "100" may correspond to a fifth low-power, high-speed mode LPHS5. In the fifth mode Mode5, the memory device 1200 may operate at a speed of, for example, 8000 Mbps maximally.

FIG. 4D is a table illustrating another embodiment of a mode set.

Referring to FIG. 4D, this mode set may include a plurality of modes depending on a magnitude of power consumption under the same performance.

The first mode Mode1 corresponding to an operation code of "000" may correspond to a normal mode. In the first mode Mode1, the memory device 1200 may operate at a speed of, for example, 6400 Mbps maximally.

The second mode Mode2 corresponding to an operation code of "001" may correspond to a first low-power mode LP1. In the second mode Mode2, a latency that is (1×L) is identical to that in the first mode Mode1, but a voltage level is set to, for example, (0.9×VDD). Accordingly, in the second mode Mode2, power consumption may decrease without a decrease in a latency, compared to the first mode Mode1. In the second mode Mode2, the memory device 1200 may operate at a speed of, for example, 6000 Mbps maximally.

The third mode Mode3 corresponding to an operation code of "010" may correspond to a second low-power mode LP2. In the third mode Mode3, a voltage level may be set to (0.8×VDD), and the memory device 1200 may operate at a speed of, for example, 5500 Mbps maximally.

The fourth mode Mode4 corresponding to an operation code of "011" may correspond to a third low-power mode LP3. In the fourth mode Mode4, a voltage level may be set to (0.7×VDD), and the memory device 1200 may operate at a speed of, for example, 5000 Mbps maximally.

The fifth mode Mode5 corresponding to an operation code of "100" may correspond to a fourth low-power mode LP4. In the fifth mode Mode5, a voltage level may be set to (0.6×VDD), and the memory device 1200 may operate at a speed of, for example, 4500 Mbps maximally.

FIG. 5 is a table illustrating the process information PI of FIG. 1.

Referring to FIG. 5, the process information PI may include information about a process applied to the memory device 1200.

The memory device 1200 may output the process information PI in response to a request of the system-on-chip 1100. The memory device 1200 may output the process information PI in compliance with a protocol set in advance with the system-on-chip 1100 through a data input/output pin. In another implementation, the memory device 1200 may output the process information PI through a pin provided separately for an output of the process information PI.

The process information PI may be information that indicates whether an enhanced process is applied in manufacturing the memory device 1200. For example, the case where a logical value of the process information PI is "0" may represent a case where a manufacturing process of the memory device 1200 corresponds to a legacy process, and the case where the logical value of the process information PI is "1" may represent the case where the manufacturing process of the memory device 1200 corresponds to an enhanced process that provides higher performance.

The enhanced process may correspond to, for example, a high-K metal gate (HKMG) process or a fin field effect transistor (FinFET) process used to form high-performance logic components. Accordingly, logic circuits included in the memory device 1200 corresponding to the process information PI having a logical value of "1" may be formed by using the high-K metal gate (HKMG) process or the fin field effect transistor (FinFET) process. In the memory device 1200 corresponding to the process information PI having a logical value of "1", the peripheral circuits 1220 to 1280 (for example, other than the cell array 1210) may be formed by using the enhanced process described above.

Figure 6:
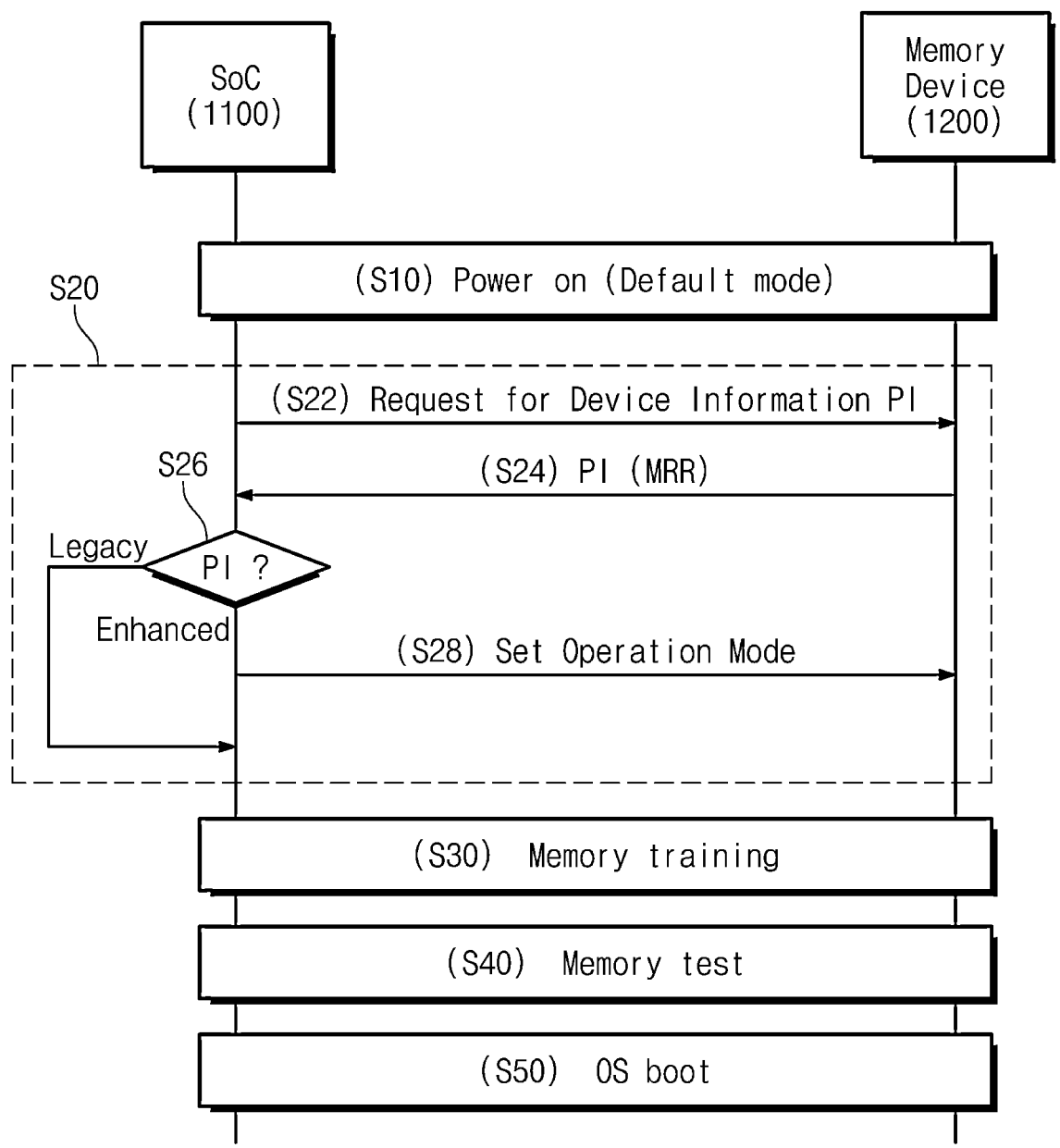
FIG. 6 is a diagram illustrating an operation of an electronic device using the process information PI, according to an example embodiment.

FIG. 6 is a diagram illustrating an operation of an electronic device using the process information PI, according to an example embodiment.

Referring to FIG. 6, in a booting phase of the electronic device 1000, the memory device 1200 may provide the process information PI to the system-on-chip 1100.

In operation S10, a booting sequence may be initiated when power is supplied to the electronic device 1000 or the system-on-chip 1100 (power-on). Also, the booting sequence may be initiated in a case where the electronic device 1000 or the system-on-chip 1100 is automatically rebooted, for example, due to a system error occurring in a previous operation. When a power is supplied to the electronic device 1000, the system-on-chip 1100 supplies the power to the memory device 1200 and initializes the memory device 1200. In this case, a voltage or a clock frequency that is supplied to the memory device 1200 may be a default voltage or a default clock frequency.

In operation S20, the system-on-chip 1100 may receive the process information PI from the memory device 1200 and may set an operation mode. Operation S20 may be subdivided into operation S22, operation S24, operation S26, and operation S28. In operation S22, the system-on-chip 1100 may request the process information PI from the memory device 1200. In operation S24, the memory device 1200 transfers the process information PI to the system-on-chip 1100, and the memory device 1200 may provide the process information PI in a mode register read (MRR) manner. In operation S26, the system-on-chip 1100 checks the process information PI. For example, the system-on-chip 1100 may determine whether a process applied to the memory device 1200 is a legacy process or an enhanced process. When it is determined that the process applied to the memory device 1200 is a legacy process, the procedure may proceed to operation S30. When it is determined that the process applied to the memory device 1200 is an enhanced process, the procedure may proceed to operation S28. In operation S28, the system-on-chip 1100 sets an operation mode of the memory device 1200. For example, the system-on-chip 1100 may adjust an operation parameter of the memory device 1200 in an operation mode selected by a user.

In operation S30, a training operation may be performed on the memory device 1200. The system-on-chip 1100 may make the reliability of data or signal exchange with the memory device 1200 high through the training operation. For example, the system-on-chip 1100 may determine an optimum clock timing or an optimum level of a reference voltage by writing and reading training data in and from the memory device 1200 under various conditions. The training operation of the memory device 1200 may be performed after a test procedure (described below) is terminated.

In operation S40, a test operation may be performed on the memory device 1200. For example, first, the system-on-chip 1100 may write a predetermined test pattern in the memory device 1200 for the purpose of testing the memory device 1200. The system-on-chip 1100 may execute a test operation on the memory device 1200 by using a command, an address, and data corresponding to a test pattern generated for the test operation.

When the test operation associated with the memory device 1200 is terminated, in operation S50, the operating system OS may be loaded onto the memory device 1200 provided as a main memory. As the operating system OS is loaded, the operating system OS may have the overall control authority of a system.

The test procedure of the memory device 1200 that is performed in booting the electronic device 1000 is briefly described above. The process information PI may further include various additional information.

Figure 7:
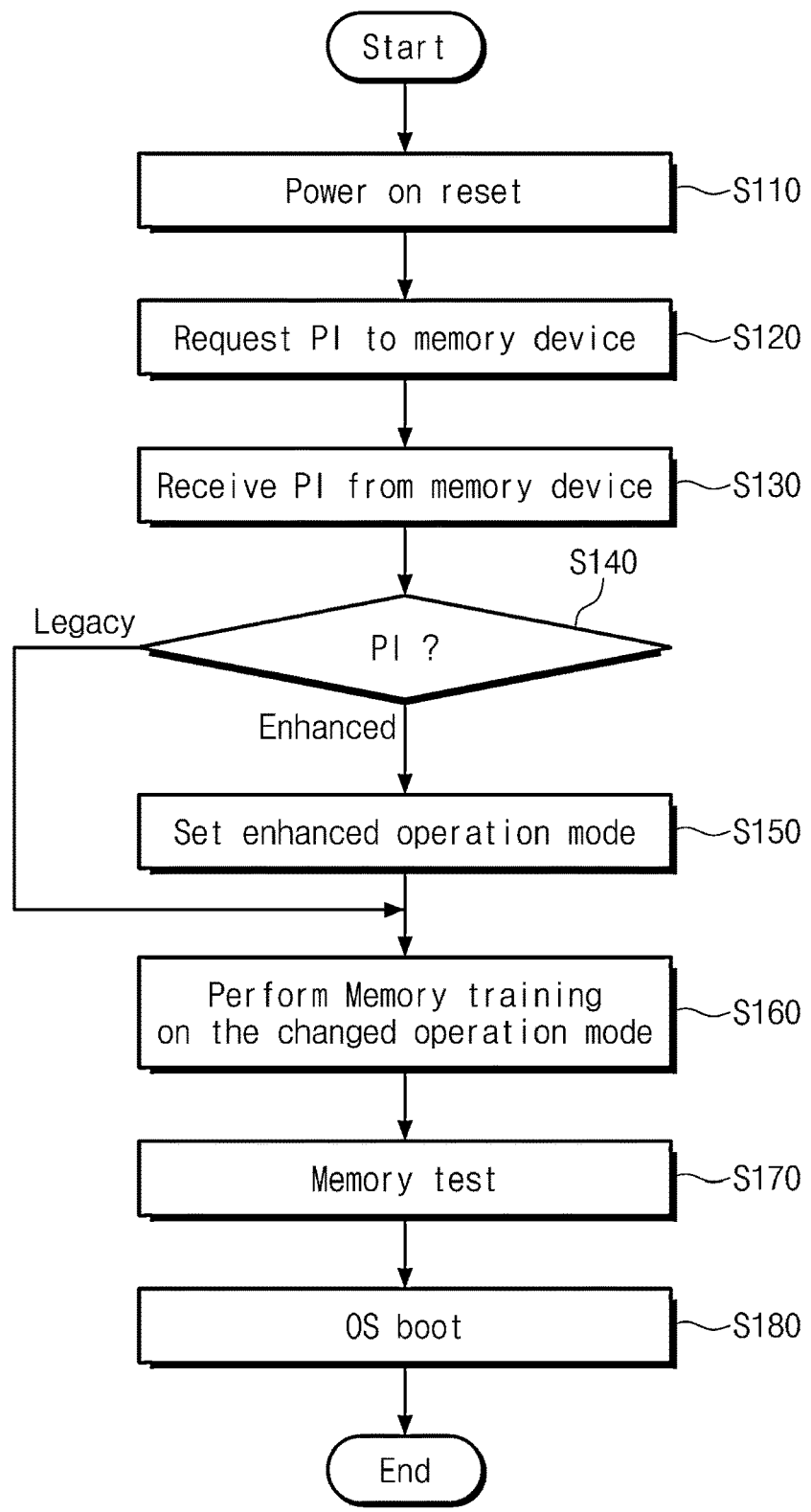
FIG. 7 is a flowchart illustrating an operation of a system-on-chip in an operation of FIG. 6.

FIG. 7 is a flowchart illustrating an operation of a system-on-chip in an operation of FIG. 6.

Referring to FIG. 7, the system-on-chip 1100 may receive the process information PI from the memory device 1200 and may set a level of a performance or a power of the memory device 1200 depending on the received process information PI.

In operation S110, the system-on-chip 1100 may supply power to the memory device 1200, for example, by a power supply or a reset operation. In this case, a voltage or a clock frequency provided to the memory device 1200 may be a default voltage or clock frequency corresponding to a default operation mode.

In operation S120, the system-on-chip 1100 may request the process information PI from the memory device 1200. The system-on-chip 1100 may request a mode register read MRR of the memory device 1200 and may request the process information PI programmed at the memory device 1200. The memory device 1200 may output the process information PI in response to a request of the system-on-chip 1100. For example, the memory device 1200 may output the process information PI to the system-on-chip 1100 in the form of a flag signal. The process information PI may be provided to the system-on-chip 1100 through a separate pin or through a side channel that is used for a purpose other than a data exchange.

In operation S130, the system-on-chip 1100 may receive the process information PI output from the memory device 1200.

In operation S140, the system-on-chip 1100 may check the process information PI. The system-on-chip 1100 may determine whether the process information PI corresponds to a legacy process or an enhanced process. When the process information PI corresponds to the legacy process, the procedure may proceed to operation S160. When the process information PI corresponds to the enhanced process, the procedure may proceed to operation S150.

In operation S150, the system-on-chip 1100 may set an operation mode of the memory device 1200. In the case of the memory device 1200 manufactured by the enhanced process, an operating speed may increase, and power consumption may decrease. This may mean that a latency decreases. In this case, an operation mode having a latency value that the user selects in advance may be selected. To set the memory device 1200 to the selected operation mode, the system-on-chip 1100 may set the memory device 1200 with parameters of the selected operation mode. For example, the system-on-chip 1100 may set a parameter of the memory device 1200 through a mode register write (MRW) operation.

In operation S160 a training operation may be performed on the memory device 1200. In the case where the operation mode of the memory device 1200 is set to an operation mode corresponding to the enhanced process, the memory device 1200 may be set to high-speed or low-voltage parameters. Accordingly, values for the communication between the memory device 1200 and the system-on-chip 1100, such as a reference voltage Vref and a latency, may be optimized more finely through the training operation. Also, in the case that the process of the memory device 1200 corresponds to the legacy process, optimization through the training operation may be performed.

In operation S170, a test operation may be performed on the memory device 1200. For example, first, the system-on-chip 1100 may write a predetermined test pattern in the memory device 1200 for the purpose of testing the memory device 1200. The system-on-chip 1100 may execute a test operation on the memory device 1200 by using a command, an address, and data corresponding to a test pattern generated for the test operation.

When the test operation associated with the memory device 1200 is terminated, in operation S180, the operating system OS may be loaded onto the memory device 1200 provided as a main memory. As the operating system OS is loaded, the operating system OS may have the overall control authority of a system.

The operation of the system-on-chip 1100 that is performed in booting the electronic device 1000 is briefly described above. The description is given as the process information PI is information about a process (for example, legacy or enhanced) of the memory device 1200, but the process information PI may further include various information.

Figure 8:
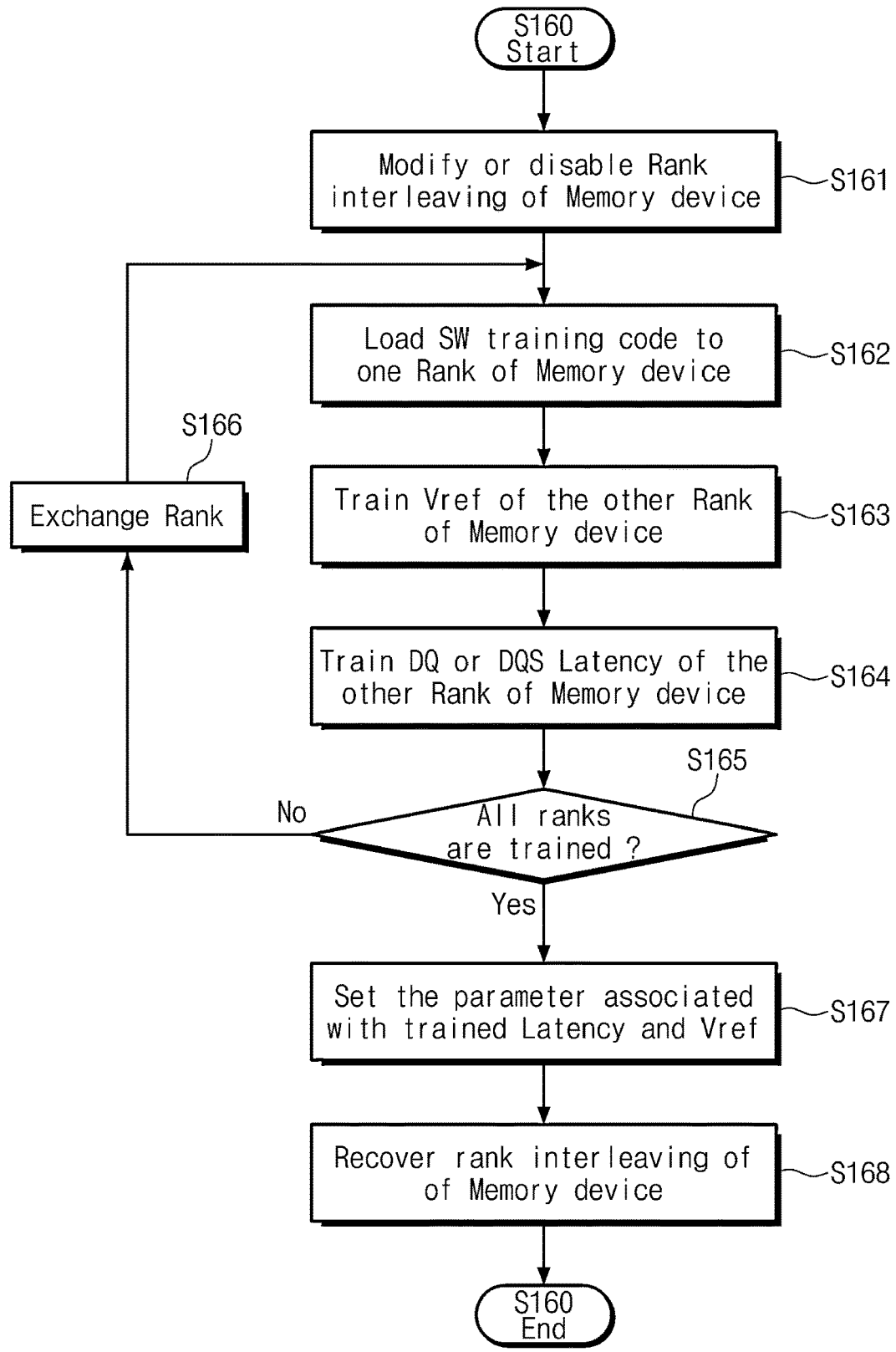
FIG. 8 is a flowchart illustrating operation S160 of FIG. 7.

FIG. 8 is a flowchart illustrating operation S160 of FIG. 7.

Referring to FIG. 8, in the training operation, the system-on-chip 1100 may perform a training operation by loading a training code onto the memory device 1200. In this case, rank interleaving of the memory device 1200 may be released to load the training code onto the memory device 1200.

In operation S161, the system-on-chip 1100 may release the rank interleaving of the memory device 1200. The rank interleaving is a memory management technique for efficiently managing an input/output channel at the memory device 1200 such as a DRAM. For example, in the case where the system-on-chip 1100 writes data in the memory device 1200, write-requested data may be partitioned in an interleaving unit. It is assumed that an interleaving unit IU is 128 Bytes, as an example. The write-requested data may be divided into 128B data (i.e., data of the interleaving unit) corresponding to respective channels, and may be written in a pipeline manner. To output data in a read operation, channels may be selected in the same manner as described above. The rank interleaving may hinder an operation of storing the training code in one area, and thus the rank interleaving may be released or disabled to store the training code.

In operation S162, the system-on-chip 1100 may load the training code onto the memory device 1200 in a state where the rank interleaving is released. The system-on-chip 1100 loads the training code onto a memory area corresponding to one rank of the memory device 1200. Here, the number of ranks included in each channel of the memory device 1200 may have various values.

In operation S163, the system-on-chip 1100 may access the rank onto which the training code is loaded, and may fetch and execute the training code. For example, the CPU 1110 that performs the training operation may fetch and execute training code the memory device 1200. As the training code is executed, training may be performed on a memory area included in at least one rank onto which the training code is not loaded. The system-on-chip 1100 may evaluate the read training data to determine an optimum parameter. The system-on-chip 1100 of example embodiments may detect a signal level of output data of the memory device 1200 through a read training operation of the memory device 1200. The optimum reference voltage Vref may be determined depending on the signal level of the output data.

In operation S164, as the training code is executed, a parameter of an input/output path of the memory device 1200 or delay states of a clock signal may be detected. The system-on-chip 1100 may determine a delay value of a clock signal, a data strobe signal DQS, or a data signal DQ of a memory area included in at least one rank onto which the training code is not loaded. The clock signal, the data strobe signal DQS, or the data signal DQ of the memory area included in the at least one rank onto which the training code is not loaded may be used as more accurate parameters in the set operation mode. For example, a timing of the strobe signal DQS that provides the highest reliability may be selected by training the data strobe signal DQS.

In operation S165, the system-on-chip 1100 may determine whether all the ranks of the memory device 1200 are trained. For example, the system-on-chip 1100 may determine whether software training associated with all the channels included in the memory device 1200 and all the ranks of the channels is completed. When a rank remains to be trained (No), the procedure proceeds to operation S166. When all the ranks are completely trained (Yes), the procedure proceeds to operation S167.

In operation S166, the system-on-chip 1100 may newly select a rank targeted for training. For example, in the case where only two ranks exist, a rank onto which the training code is previously loaded may be set to a rank targeted for training. When the selection of the target rank for training is completed, the procedure proceeds to operation S162 to perform training on the target rank.

In operation S167, the system-on-chip 1100 may set the memory device 1200 with the operation parameters that are obtained as a result of the training operation. For example, the system-on-chip 1100 may set the memory device 1200 with a timing value of the reference voltage Vref, the data strobe signal DQS, or the data signal DQ for each rank of the memory device 1200 determined in operation S163 and operation S164.

In operation S168, the system-on-chip 1100 may resume the rank interleaving of the memory device 1200 released in operation S161. For example, the system-on-chip 1100 may reset the memory device 1200. In this case, the rank interleaving of the memory device 1200 may be enabled.

An example of a fine training procedure of is briefly described above. The timings or signal levels of the system-on-chip 1100 and the memory device 1200 may be optimized by a training operation that is performed after the selection of the operation mode according to an example embodiment is completed.

Figure 9:
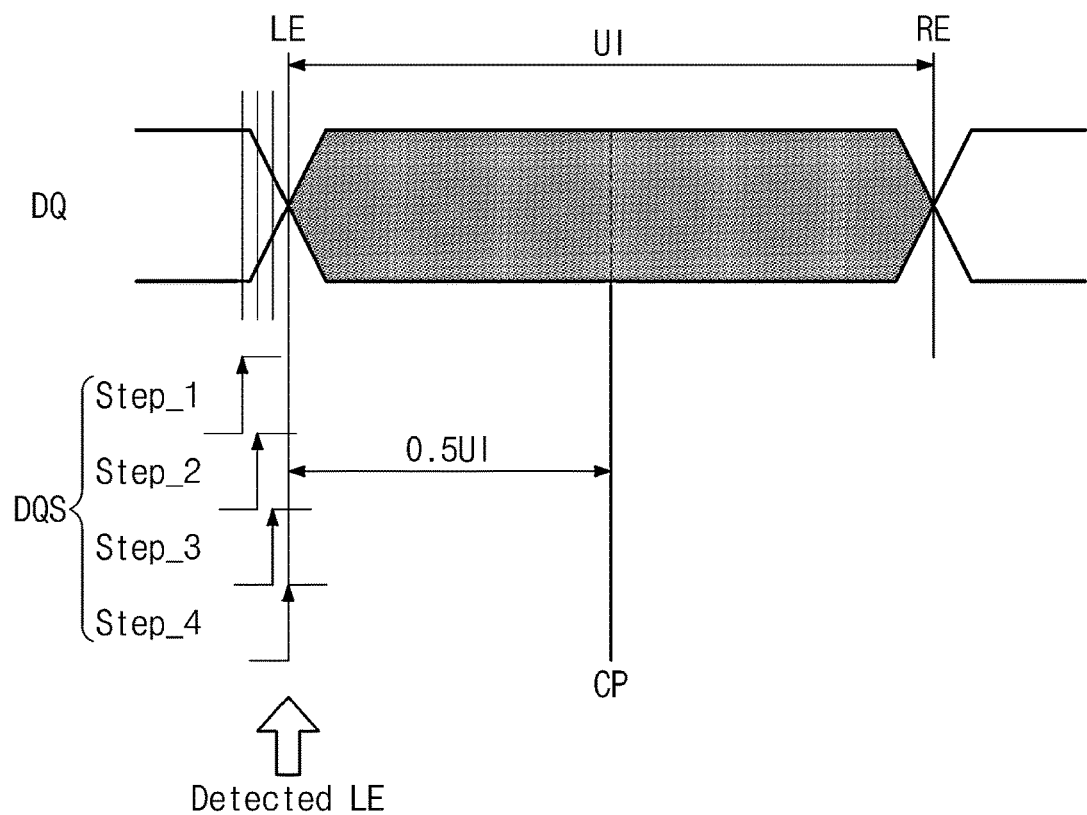
FIG. 9 is a diagram illustrating a training operation of the data signal DQ and the data strobe signal DQS described with reference to FIG. 8.

FIG. 9 is a diagram illustrating a training operation of the data signal DQ and the data strobe signal DQS described with reference to FIG. 8.

Referring to FIG. 9, in a training operation, the system-on-chip 1100 may execute a plurality of detection steps for the purpose of detecting a left edge LE of the data signal DQ.

First, the system-on-chip 1100 may determine a start point to detect the left edge LE of the data signal DQ. When the start point of the detection step is determined, a first step Step_1 of the detection step starts. The system-on-chip 1100 provides a command and an address to the memory device 1200 so as to output data of a particular pattern. Here, the particular pattern means a training pattern that is determined in advance for comparison with a logical value of the data signal DQ. The memory device 1200 may output the data strobe signal DQS and the data signal DQ in response to the command and the address.

In the first step Step_1, a rising edge of the data strobe signal DQS may be advanced with respect to the left edge LE of the unit interval UI as much as a plurality of step intervals. The system-on-chip 1100 compares the read data transferred through the data signal DQ with a reference pattern determined in advance. The system-on-chip 1100 determines whether a rising edge of the data strobe signal DQS corresponds to the left edge LE of the data signal DQ, by using a comparison result. When it is determined that the rising edge of the data strobe signal DQS is not matched with the left edge LE of the data signal DQ, the system-on-chip 1100 performs a second step Step_2 following the first step Step_1.

To perform the second step Step_2, the system-on-chip 1100 may transfer a command and an address to the memory device 1200. In this case, the memory device 1200 may output data of a particular pattern through the data strobe signal DQS and the data signal DQ. The system-on-chip 1100 compares the transferred data with the reference pattern and determines whether the rising edge of the data strobe signal DQS corresponds to the left edge LE of the data signal DQ. When it is determined in the second step Step_2 that the rising edge of the data strobe signal DQS is not matched with the left edge LE of the data signal DQ, the system-on-chip 1100 performs a third step Step_3 following the second step Step_2.

The third step Step_3 may be performed in the same manner as the second step Step_2. In an embodiment, it is assumed the case where the left edge LE is detected in a fourth step Step_4. As a result of performing the third step Step_3 for detecting the left edge LE, there may be determined that the data read from the memory device 1200 are not matched with a value corresponding to the left edge LE. In this case, the fourth step Step_4 may be performed. As a result of executing the fourth step Step_4, there may be determined that the system-on-chip 1100 detects the left edge LE. In this case, the operation of detecting the left edge LE is terminated.

According to an example embodiment, the left edge LE of the data signal DQ may be detected depending on the data training method. As the left edge LE is detected, the data signal DQ and the data strobe signal DQS are able to be aligned.

Figure 10:
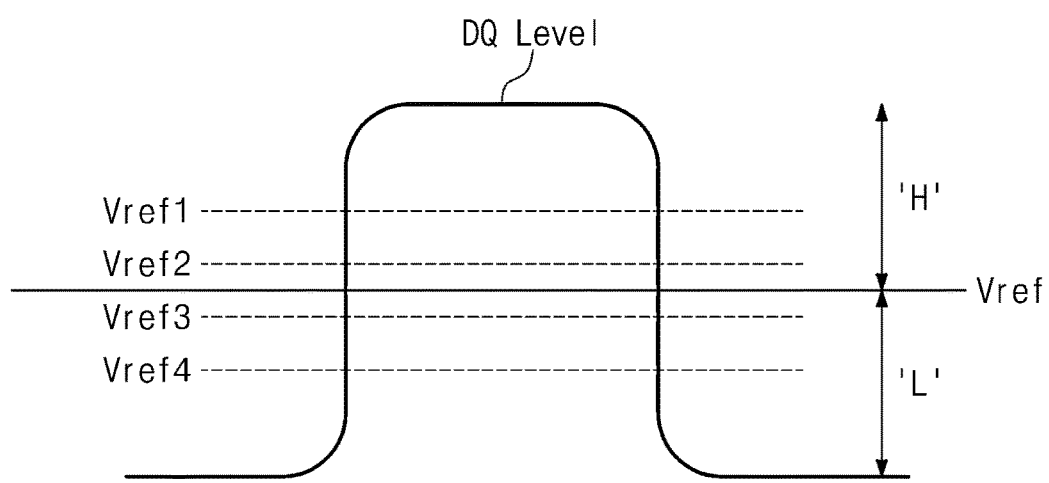
FIG. 10 is a diagram illustrating a level training operation of the data signal DQ described with reference to FIG. 8.

FIG. 10 is a diagram illustrating a level training operation of the data signal DQ described with reference to FIG. 8.

A method of training a level of the data signal DQ supplied to the memory device 1200 is illustrated in FIG. 10. Here, the level of the data signal DQ may be a level corresponding to the case where the data signal DQ is transmitted from the system-on-chip 1100 to the memory device 1200 or may be a level of a reference voltage used in sampling the data signal DQ transmitted from the system-on-chip 1100 to the memory device 1200.

When data transmitted from the system-on-chip 1100 to the memory device 1200 are transmitted only by using a reference voltage Vref1, the integrity of data of the memory device 1200 may not be guaranteed. Accordingly, the system-on-chip 1100 may write the data signal DQ in the memory device 1200 by using a plurality of reference voltages Vref1 to Vref4 for the purpose of training a reference voltage. There may be selected a reference voltage corresponding to data having the lowest error rate from among data that are read after being written.

The training of the reference voltage Vref may be applied to a reference voltage that is used for the system-on-chip 1100 to sample in a read training operation, as well as the write training operation. The system-on-chip 1100 may determine an optimum reference voltage through the training operation. The system-on-chip 1100 may set a reference generator so as to generate the determined reference voltage.

Figure 11:
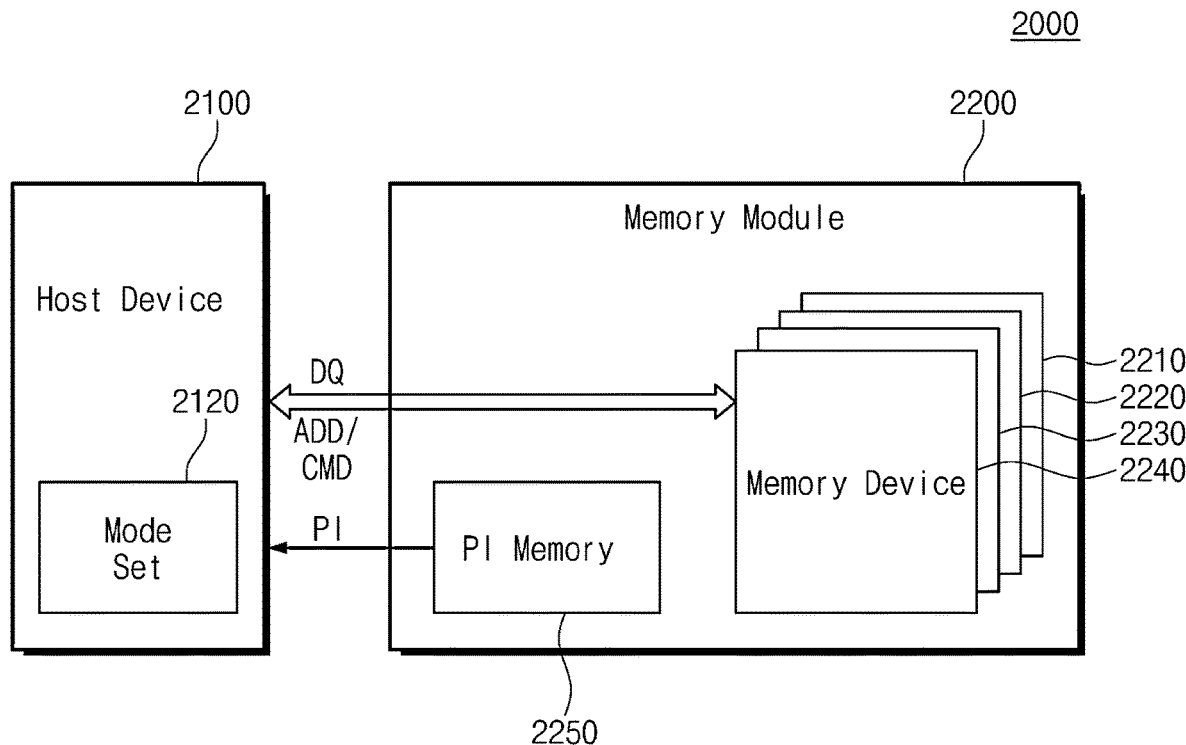
FIG. 11 is a block diagram illustrating a computing system according to an example embodiment.

FIG. 11 is a block diagram illustrating a computing system according to an example embodiment.

An electronic device 2000 may be, for example, a desktop computer, a laptop computer, a tablet computer, a smartphone, a wearable device, a server, an electric vehicle, home applications, etc. Referring to FIG. 11, the electronic device 2000 may include a host device 2100 and a memory module 2200.

The host device 2100 may perform various arithmetic/logical operations for the purpose of controlling overall operations of the electronic device 2000. The host device 2100 may include a mode set 2120, which is parameter information for controlling the performance of the memory module 2200, such as a latency, with reference to the process information PI provided from the memory module 2200. The mode set 2120 may include a plurality of modes for setting a level of a performance or power consumption of the memory module 2200. The user may select one of the plurality of modes included in the mode set 2120.

The host device 2100 may determine whether the memory module 2200 includes a semiconductor device to which a new process technology is applied, using the process information PI. For example, memory devices 2210 to 2240 included in the memory module 2200 may be manufactured by applying a high-K metal gate (HKMG) process or a fin field effect transistor (FinFET) process used to form high-performance logic components. In this case, speed and power characteristics of the memory module 2200 may be markedly improved as a supply voltage, a clock frequency, or a latency is set by the host device 2100.

When a process applied to the memory module 2200 is detected through the process information PI, the host device 2100 may set the memory module 2200 with a parameter corresponding to an operation mode that the user selects. Afterwards, the communication between the host device 2100 and the memory module 2200 may be performed depending on the set operation parameter. The host device 2100 may request and receive the process information PI from the memory module 2200 in booting or under a particular condition. The host device 2100 may control the memory module 2200 based on the set operation parameter and may provide a performance that the user requires.

The memory module 2200 may include the memory devices 2210 to 2240 and a device information memory 2250. When the electronic device 2000 is booted up, the operating system OS or application programs may be loaded onto the memory module 2200. While the electronic device 2000 is driven, the operating system OS, a running application program, update data, etc., may be stored in the memory module 2200. The memory module 2200 may include the device information memory 2250 for storing the process information PI therein. The process information PI may be provided in the form of a flag signal indicating whether a process applied to the memory module 2200 is an enhanced process or a legacy process.

The host device 2100 may provide the command CMD, the address ADD, the data strobe signal DQS, and the data signal DQ to the memory module 2200. In addition, the memory module 2200 may provide the process information PI to the memory module 2200 through a data channel or through a separate dedicated pin.

The electronic device 2000 according to an example embodiment may receive the process information PI of the memory module 2200 and may set a parameter for adjusting performances of the memory module 2200, such as power consumption and a latency. Accordingly, in the case of the memory module 2200 to which a new process technology is applied, it may be possible to provide various options for improving the performance of the electronic device 2000 or reducing the power consumption of the electronic device 2000.

Figure 12:
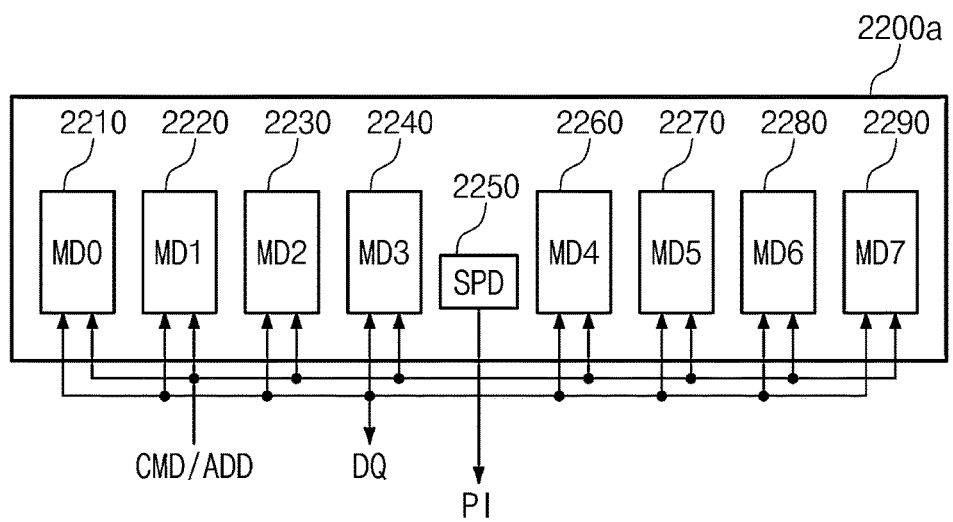
FIG. 12 is a block diagram illustrating a configuration of a memory module of FIG. 11.

FIG. 12 is a block diagram illustrating a configuration of a memory module of FIG. 11.

Referring to FIG. 12, a memory module 2200a according to an example embodiment may include a plurality of memory devices 2210 to 2240 and 2260 to 2290 and a serial component recognition device (hereinafter referred to as "SPD") 2250 storing the process information PI.

The SPD 2250 may store SPD information read in a booting operation and the process information PI of example embodiments. The SPD information may include, for example, a size, a capacity, a driving speed, a driving voltage, chip layout information, and a module ID of the memory module 2200a. For example, in the process of manufacturing the memory module 2200a, the process information PI may be programmed in the SPD 2250. An expanded memory area capable of storing the process information PI may be provided in the SPD 2250.

Figure 13:
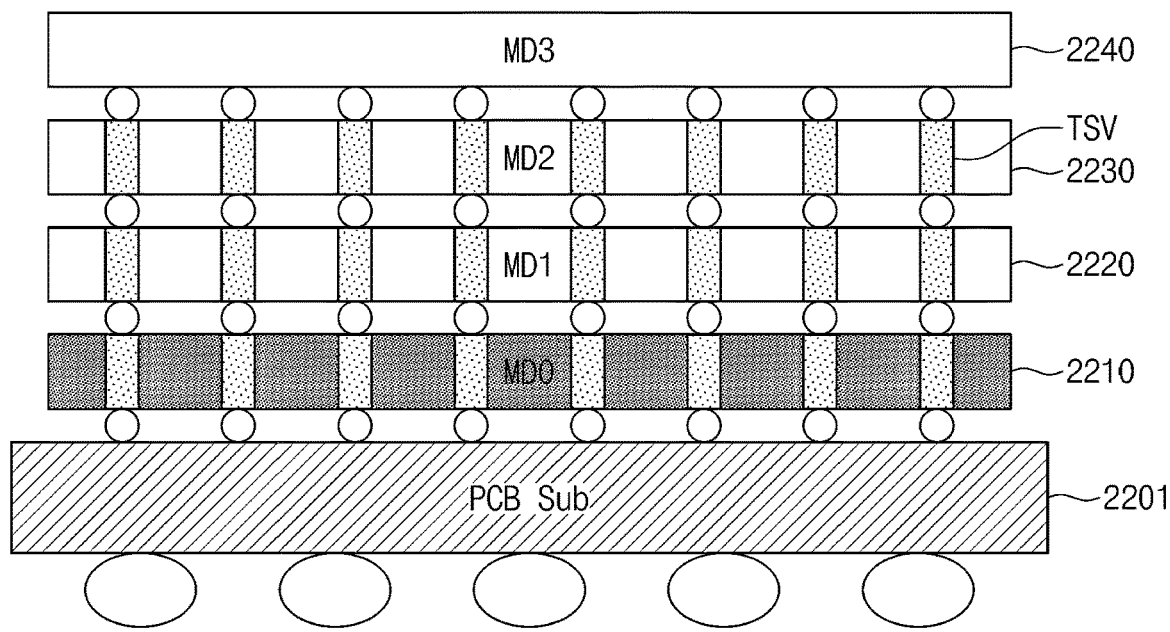
FIG. 13 is a block diagram illustrating another example of a memory module of FIG. 11.

FIG. 13 is a block diagram illustrating another example of a memory module of FIG. 11.

Referring to FIG. 13, a memory module 2200b may include the plurality of memory devices 2210 to 2240 stacked on a PCB substrate 2201. The process information PI may be output from at least one of the plurality of memory devices 2210 to 2240.

The plurality of memory devices 2210 to 2240 may be stacked using through silicon vias (TSVs). The memory module 2200b may provide the process information PI to a memory controller (not illustrated) or a host such as a system-on-chip. Only one (for example, 2210) of the plurality of memory devices 2210 to 2240 may output the process information PI. For example, only the memory device 2210 may provide the process information PI through the mode register read (MRR) operation so as to provide notification that the memory module 2200b is a memory module manufactured by using an enhanced process.

The plurality of memory devices 2210 to 2240 may be chips that are manufactured by using a same process. Alternatively, one (for example, 2210) of the plurality of memory devices 2210 to 2240 may be a chip that is manufactured by using an enhanced process, and the remaining memory devices 2220 to 2240 may be chips that are manufactured by using a legacy process. Hot data may be mainly stored in the memory device 2210, and cold data may be stored in the remaining memory devices 2220 to 2240.

Figure 14:
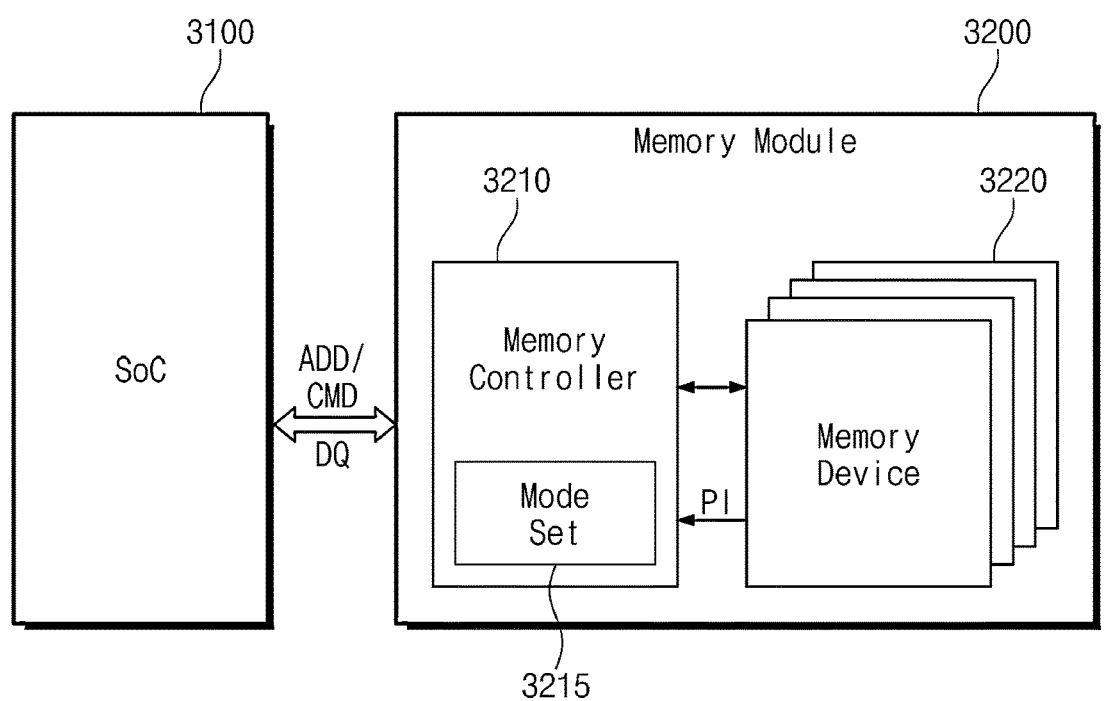
FIG. 14 is a block diagram illustrating an electronic device according to an example embodiment.

FIG. 14 is a block diagram illustrating an electronic device according to an example embodiment.

Referring to FIG. 14, an electronic device 3000 may include a system-on-chip 3100, and a memory module 3200 in which a memory controller 3210 is embedded.

The memory module 3200 may include the memory controller 3210 and a memory device 3220 embedded therein. The memory controller 3210 may include a mode set 3215 storing a plurality of operation modes. The memory device 3220 may provide the process information PI to the memory controller 3210. The memory controller 3210 may select one of the plurality of operation modes with reference to the process information PI.

By way of summation and review, an application processor ("AP") may be used as a core driving processor of a mobile device. A volatile memory device such as a dynamic random access memory (DRAM) may be used as a main memory or a working memory of the AP including various intellectual properties ("IPs"). Demands for high-performance and high-capacity memories may drive increases in an operating frequency and a storage capacity of the working memory. Generally, an operating speed of an application processor may be higher than a response speed of the working memory. Also, bandwidths of working memories that are used under various operation conditions may be different. Accordingly, a bandwidth optimized to a scenario may be secured in a way to vary a frequency of a working memory. However, it may be difficult to adjust some operation parameters due to reliability constraints even when the frequency is variable. It may be possible to improve the performance of the AP by developing and applying a new process with regard to a working memory such as a DRAM.

As described above, embodiments relate to a semiconductor memory device capable of adjusting a latency by using process information, an electronic device including the same, and a method for setting the same.

According to an example embodiment, the performance of a memory device may be maximized by adjusting a latency based on a performance that is enhanced by manufacturing using an advanced process. Embodiments may provide a semiconductor memory device capable of adjusting a latency depending on a process used to manufacture a memory device, an electronic device including the same, and a method for setting the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device configured to:
provide, to a host, process information indicating whether a process used to manufacture the semiconductor memory device is a legacy process providing first device performance or an enhanced process which provides second device performance higher than the first device performance of the legacy process, the process information being stored in the semiconductor memory device as a part of the process of manufacturing the semiconductor memory device;
receive, from the host, an instruction to set an operation mode of the semiconductor memory device to a target operation mode, the target operation mode being selected, based on the process information, among a plurality of operation modes, and the plurality of operation modes defining a plurality of respectively different latencies, by which data are output from the semiconductor memory device in response to a read command; and
set the operation mode of the semiconductor memory device to the target operation mode,
wherein the plurality of respectively different latencies include a first latency and a second latency, the second latency being longer than the first latency, and
wherein a first operation mode is selected as the target operation mode in response to the process information indicating the enhanced process, and a second operation mode is selected as the target operation mode in response to the process information indicating the legacy process.

2. The semiconductor memory device as claimed in claim 1,
wherein the enhanced process corresponds to a high-K metal gate process or a fin field effect transistor process.

3. The semiconductor memory device as claimed in claim 1,
wherein each of the first device performance and the second device performance indicates at least one of a voltage level, a clock frequency, and a latency.

4. The semiconductor memory device as claimed in claim 1,
wherein the plurality of operation modes include:
a third operation mode, in which the semiconductor memory device is set to operate at a third latency and a first voltage level,
a fourth operation mode, in which the semiconductor memory device is set to operate at the third latency and a second voltage level, the second voltage level being less than the first voltage level, and
a fifth operation mode, in which the semiconductor memory device is set to operate at a fourth latency and the first voltage level, the fourth latency being less than the third latency.

5. The semiconductor memory device as claimed in claim 1,
wherein the process information corresponds to the process used to manufacture a peripheral circuit to control a cell array of the semiconductor memory device.

6. The semiconductor memory device as claimed in claim 1, further comprising a program component configured to store the process information.

7. The semiconductor memory device as claimed in claim 1,
wherein the process information is provided through a mode register read by the host.

8. The semiconductor memory device as claimed in claim 1, further comprising a mode register set configured to indicate at least one of an operating voltage level or an operating speed corresponding to the target operation mode.

9. A host configured to control a semiconductor memory device configured to:
read, from the semiconductor memory device, process information indicating whether a process used to manufacture the semiconductor memory device is a legacy process providing first device performance or an enhanced process which provides second device performance higher than the first device performance of the legacy process, the process information being stored in the semiconductor memory device as a part of the process of manufacturing the semiconductor memory device;
select a target operation mode among a plurality of operation modes depending on the process information; and
set an operation mode of the semiconductor memory device based on the selected target operation mode, wherein the plurality of operation modes define a plurality of respectively different latencies, by which data are output from the semiconductor memory device in response to a read command, wherein the plurality of respectively different latencies include a first latency and a second latency, the second latency being longer than the first latency, and wherein a first operation mode is selected as the target operation mode in response to the process information indicating the enhanced process, and a second operation mode is selected as the target operation mode in response to the process information indicating the legacy process.

10. The host as claimed in claim 9,
wherein the enhanced process corresponds to a high-K metal gate process or a fin field effect transistor process.

11. The host as claimed in claim 9,
wherein each of the first device performance and the second device performance indicates at least one of a voltage level, a clock frequency, and a latency.

12. The host as claimed in claim 9,
wherein the plurality of operation modes include:
a third operation mode, in which the semiconductor memory device is set to operate at a third latency and a first voltage level,
a fourth operation mode, in which the semiconductor memory device is set to operate at the third latency and a second voltage level, the second voltage level being less than the first voltage level, and
a fifth operation mode, in which the semiconductor memory device is set to operate at a fourth latency and the first voltage level, the fourth latency being less than the third latency.

13. The host as claimed in claim 9,
wherein the process information corresponds to the process used to manufacture a peripheral circuit to control a cell array of the semiconductor memory device.

14. The host as claimed in claim 9,
wherein the process information is read from a mode register of the semiconductor memory device.

15. The host as claimed in claim 9, wherein, further configured to set the operation mode of the semiconductor memory device with an operation parameter corresponding to the first operation mode in response to the process information corresponding to the enhanced process.

16. The host as claimed in claim 15, further configured to perform a training operation for optimizing a reference voltage level and a timing of the semiconductor memory device set with the operation parameter.

* * * * *